United States Patent
Schulze et al.

(10) Patent No.: US 8,779,462 B2
(45) Date of Patent: Jul. 15, 2014

(54) HIGH-OHMIC SEMICONDUCTOR SUBSTRATE AND A METHOD OF MANUFACTURING THE SAME

(75) Inventors: Hans-Joachim Schulze, Taufkirchen (DE); Hans-Joerg Timme, Ottobrunn (DE); Frank Pfirsch, Munich (DE)

(73) Assignee: Infineon Technologies AG, Neubiberg (DE)

( * ) Notice: Subject to any disclaimer, the term of this patent is extended or adjusted under 35 U.S.C. 154(b) by 680 days.

(21) Appl. No.: 12/123,278

(22) Filed: May 19, 2008

(65) Prior Publication Data

US 2009/0283866 A1  Nov. 19, 2009

(51) Int. Cl.
*H01L 29/34* (2006.01)
*H01L 21/04* (2006.01)

(52) U.S. Cl.
USPC ........... 257/101; 257/607; 257/610; 257/612; 438/510; 438/514; 438/543

(58) Field of Classification Search
CPC .................. H01L 21/26513; H01L 21/02573; H01L 29/0878; H01L 29/66712; H01L 29/7802; H01L 33/305; H01L 33/325; H01L 35/16; H01L 21/02532; H01L 29/167; H01L 29/18; H01L 29/36; H01L 33/06; H01L 21/2253; H01L 21/22
USPC ..... 438/FOR. 478, FOR. 481, 510, 514–517, 438/542–549; 257/101, 607–612, E29.109
See application file for complete search history.

(56) References Cited

U.S. PATENT DOCUMENTS

| | | | | |
|---|---|---|---|---|
| 3,568,108 A | * | 3/1971 | Poirier et al. | 333/187 |
| 3,919,009 A | * | 11/1975 | Borchert et al. | 438/133 |
| 4,503,450 A | * | 3/1985 | Brewer | 257/218 |
| 5,096,839 A | * | 3/1992 | Amai et al. | 438/16 |
| 2002/0153616 A1 | * | 10/2002 | Kunihisa et al. | 257/778 |
| 2004/0009649 A1 | * | 1/2004 | Kub et al. | 438/459 |
| 2006/0197149 A1 | * | 9/2006 | Fujimoto | 257/335 |
| 2007/0015299 A1 | * | 1/2007 | Saxler | 438/22 |
| 2007/0075332 A1 | * | 4/2007 | Tokuda et al. | 257/153 |
| 2008/0006823 A1 | * | 1/2008 | Kurita | 257/51 |
| 2008/0296612 A1 | * | 12/2008 | Schmidt et al. | 257/139 |
| 2009/0146531 A1 | * | 6/2009 | Ruby et al. | 310/324 |

OTHER PUBLICATIONS

S.M. Sze "Semiconductor Devices. Physics and Technology. 2nd Edition", © 2002, John Wiley and Sons, p. 33-34, 38, 43, 53, 55, 261-262, 334-335, 347, 351, 365, 452, and 477.*

Muller et al. Device Electronics for Integrated Circuits, pp. 11-24, 31, 34-37, 1977, John Wiley & Sons.*

* cited by examiner

*Primary Examiner* — H Tsai
(74) *Attorney, Agent, or Firm* — Slater & Matsil, L.L.P.

(57) ABSTRACT

The semiconductor substrate includes a high-ohmic semiconductor material with a conduction band edge and a valence band edge, separated by a bandgap, wherein the semiconductor material includes acceptor or donor impurity atoms or crystal defects, whose energy levels are located at least 120 meV from the conduction band edge, as well as from the valence band edge in the bandgap; and wherein the concentration of the impurity atoms or crystal defects is larger than $1 \times 10^{12}$ cm$^{-3}$.

32 Claims, 4 Drawing Sheets

HIGH-OHMIC SEMICONDUCTOR SUBSTRATE AND A METHOD OF MANUFACTURING THE SAME

BACKGROUND

Embodiments of the invention relate to a semiconductor substrate with a high-ohmic semiconductor material. Such a semiconductor substrate may, for example, be used as a substrate carrier for high (radio) frequency (RF) devices. Embodiments of the invention further relate to a method for manufacturing such a semiconductor substrate comprising a high-ohmic semiconductor material.

DETAILED DESCRIPTION OF ILLUSTRATIVE EMBODIMENTS

Figure 1:
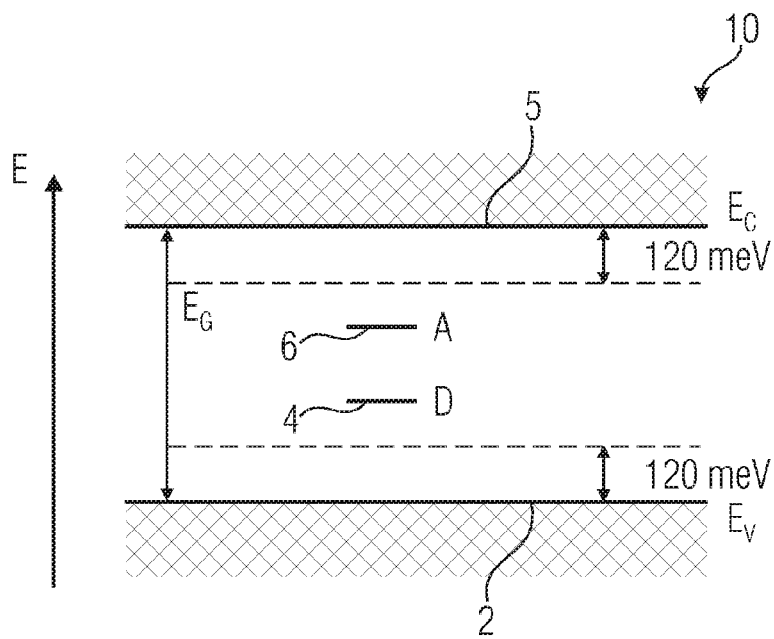
FIG. 1 shows a simplified band diagram of a high-ohmic semiconductor substrate comprising acceptor and donor impurity atomic levels within the bandgap according to an embodiment of the invention.

With reference to the accompanying FIGS. 1-6, explanations and embodiments relating to the semiconductor substrate with a high-ohmic semiconductor material and to a method for manufacturing the same, are provided.

For certain electrical devices, a high-ohmic semiconductor substrate with a semiconductor material comprising a high resistivity is needed in order to minimize a current flow to the backside of the semiconductor substrate. In particular, the high (radio) frequency (RF) performance of passive devices may be crucially limited by parasitic substrate influences. Technologies for manufacturing and integration, respectively, of passive high frequency devices, as, for example, inductor coils, capacitors, or resonators are nowadays based on modern silicon planar technology. For achieving high quality factors Q for such passive devices or bulk acoustic wave (BAW) resonators, for example, generally insulating, semi-insulating, or at least high-ohmic substrates are necessary. As an insulating substrate, for example, a glass carrier can be used and for a semi-insulating substrate gallium arsenide (GaAs) can, for example, be used. A silicon wafer can serve as a high-ohmic substrate, wherein the specific resistivity should be typically 100 Ohm cm or higher. The use of high-ohmic silicon substrates can result in a principle technical problem, however. Depending on the respective production process, the doping of high-ohmic silicon substrates can change, and therefore the high resistivity of silicon substrates is not a stable process invariant feature of the wafer. For example, certain oxygen complexes can be formed, so-called thermal donors, which have an n-type doping effect on the silicon substrate and which can change a weak p-type doping of a high-ohmic wafer, so that at the end of the production process, the manufactured high-frequency devices are finally arranged on a low-ohmic, n-type doped silicon substrate. As a consequence, the RF devices exhibit a significant change for the worse in their high frequency performance. This may lead to violation of device or product specifications and result in yield loss.

So far, in the 150 mm (6 inch) process technology, float zone (FZ) silicon wafers have been used as semiconductor substrates for the abovementioned passive RF devices. Due to the manufacturing method of such float zone wafers, only a small concentration of interstitial oxygen is present, which prevents the formation of thermal donors. The used high-ohmic p-type doped starting material then maintains its initial high specific resistance. However, for the 200 mm (8 inch) production technologies, float zone silicon wafers are hardly available. Instead, the available Czochralski (CZ) or Magnetic Czochralski (MCZ) wafer material comprises, due to a different manufacturing process technology, a significantly higher concentration of interstitial oxygen. The typical interstitial oxygen concentration for a CZ silicon substrate is between $5 \times 10^{17}$ cm$^{-3}$ and $9 \times 10^{17}$ cm$^{-3}$ and for a MCZ silicon substrate between $2 \times 10^{17}$ cm$^{-3}$ and $5 \times 10^{17}$ cm$^{-3}$. This high concentration of interstitial oxygen may lead, depending on the respective process for the device manufacturing, to a significant creation of thermal donors and, therefore, to a bad quality factor Q of the resulting RF devices. This effect can be seen in different RF technologies, for example, in technologies for integrated passive (and active) RF devices or in technologies for BAW (bulk acoustic wave) resonators and filters.

A semiconductor substrate with a very good stability of the high resistivity according to an embodiment of the invention is schematically shown in a simplified band diagram in FIG. 1. The energy E of an electron is depicted schematically on the y-axis of the band diagram. The semiconductor substrate 10 comprises a high-ohmic semiconductor material with a conduction band edge $E_C$ 5 and a valence band edge $E_V$ 2 separated by a bandgap $E_G$, wherein the semiconductor material comprises acceptor A or/and donor D impurities, whose impurity levels 6 and 4, are located at least 120 meV from the conduction band edge 5, as well as from the valence band edge 2, within the bandgap. The concentration of the impurity atoms may be larger than $1 \times 10^{12}$ cm$^{-3}$. The impurity atoms of the semiconductor substrate may be acceptor impurities, which may (partly) compensate thermal donor levels created from interstitial oxygen. The semiconductor substrate may be high-ohmic, but with a high concentration of interstitial oxygen, and it may be, for example, CZ or MCZ semiconductor material. The semiconductor material may typically comprise a concentration of interstitial oxygen between $2 \times 10^{17}$ cm$^{-3}$ and $9 \times 10^{17}$ cm$^{-3}$. The semiconductor substrate 10 may comprise intentionally added impurity atoms, which comprise deep energy levels located in the bandgap of the respective semiconductor material.

According to an embodiment of the present invention, the acceptor or donor impurity atoms are neither oxygen atoms, nor carbon atoms or hydrogen atoms.

The semiconductor substrate may then comprise a concentration of acceptor or donor impurity atoms, which is larger than $1 \times 10^{13}$ cm$^{-3}$. The impurity atoms may be, for example, gold (Au), indium (In), sulfur (S), platinum (Pt) or selenium (Se) atoms. In embodiments of the invention, the semiconductor substrate with a high-ohmic semiconductor material may comprise a maximum concentration of the impurity atoms, which is smaller or equal to $1 \times 10^{17}$ cm$^{-3}$. The impurity atoms may comprise at least one deep impurity level, which is located at least 120 meV from $E_C$ and $E_V$ in the bandgap of the respective semiconductor material. The semiconductor substrate 10 may be manufactured using the CZ or the MCZ growing technique. The additional dopant, i.e., these impurity atoms with deep impurity levels in the bandgap of the semiconductor material, may be added, in order to compensate or overcompensate an existing p-type or n-type base doping of the semiconductor substrate. A semiconductor substrate, for example, silicon, may comprise a p-type dopant, for example, boron, and hence donor impurity atoms may be added on purpose by conventional means to the semiconductor substrate. The semiconductor substrate can also comprise an n-type base doping, for example, with arsenic, phosphorus, or antimony atoms. In this case, the impurity atoms may be acceptor impurity atoms, which can compensate a n-type base substrate doping. If the concentration of the impurity atoms is higher than a base doping of the semiconductor substrate only a part of this excess impurity atoms, with their deep lying energy levels in the bandgap of the semiconductor substrate, will be electrically activated.

In general, when a semiconductor is doped with donor or acceptor impurity atoms, impurity energy levels or just energy levels are introduced. A donor level is defined as being neutral if filled by an electron, and positive, if empty. An acceptor level is neutral if empty (i.e. filled with a hole), and negative if filled by an electron (i.e., with no hole present).

If the semiconductor substrate comprises acceptor impurity atoms with deep acceptor levels in the bandgap, in order to compensate or overcompensate an n-type base doping of the semiconductor substrate, thermal donors which can be created by oxygen complexes, can be almost compensated by the excess impurity atoms and may be therefore ineffective concerning the resistivity of the semiconductor substrate.

Preferably, the whole wafer bulk volume should contain such atoms with deep levels, but at least 50% of the wafer volume should be doped with such atoms.

Another possibility to create deep levels in the bandgap is the irradiation of the substrate with light high-energetic particles like, e.g., electrons or protons. The irradiation energy of these particles should be sufficient so that their penetration depths corresponds to at least 50% of the wafer thickness. Also gamma irradiation can be used for the creation of Si defects or crystal defects in a substrate with deep energy levels. In the annealing step after the irradiation, the annealing temperature should be below 300° C. By irradiating, for example, a Si substrate, crystal defects can be generated in the substrate, which comprise deep energy levels within the bandgap of the Si semiconductor material.

Figure 2:
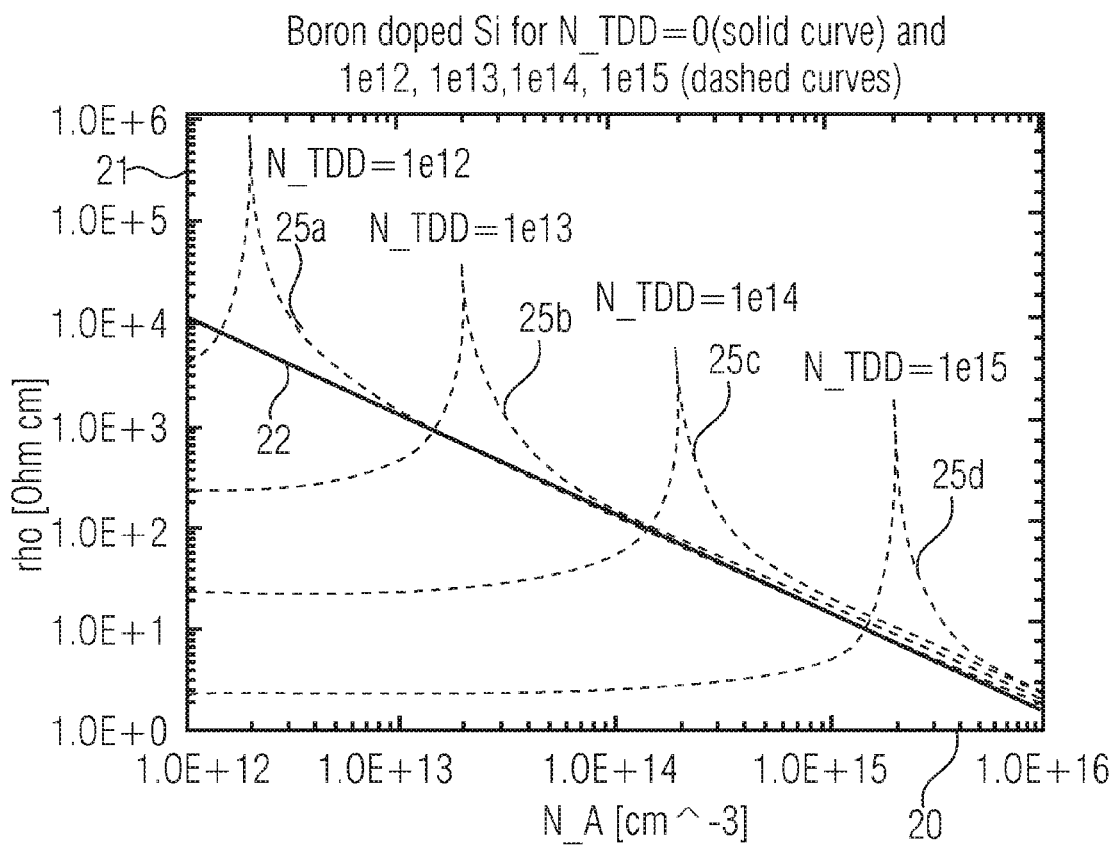
FIG. 2 shows a diagram of the resistivity of silicon depending on the acceptor concentration of a boron doping and the influence of thermally generated donors on the resistivity of the silicon.

In FIG. 2, the influence of thermal donors, in the case of the oxygen complex related thermal double donors (TDD), on the resistivity of a silicon substrate is depicted. On the x-axis in FIG. 2, the acceptor concentration N_A of a p-type boron doped silicon substrate is shown. On the y-axis, the specific resistance ρ in Ohm cm is depicted. The solid curve 22 shows the specific resistance depending on the acceptor concentration in the silicon semiconductor substrate. The influence of the thermal double donors (TDD), which are oxygen complexes created from interstitial oxygen in the silicon semiconductor substrate, on the specific resistance ρ of the silicon semiconductor substrate is shown for different thermal double donor concentrations N_TDD. The curve 25a shows the specific resistance for a thermal double donor concentration of $1 \times 10^{12}$ cm$^{-3}$, the curve 25b for a concentration of $1 \times 10^{13}$ cm$^{-3}$, the curve 25c for a concentration of $1 \times 10^{14}$ cm$^{-3}$ and the curve 25d for a thermal double donor concentration of $1 \times 10^{15}$ cm$^{-3}$. At the peaks of the curves 25a, 25b, 25c, and 25d, the total doping of the silicon semiconductor substrate may change from a p-type doping, which is given by the acceptor concentration of the boron doping to an n-type doping of the substrate, which is given by the thermal double donors. Since the thermal double donators (TDD) can release two electrons, to compensate or over-compensate the boron p-type base doping of the semiconductor substrate, the peak appears at the two-fold concentration of the respective acceptor concentration. This means, for example, that for a thermal TDD concentration of $1 \times 10^{13}$ cm$^{-3}$ 25b, the respective boron doping acceptor concentration N_A has to be $2 \times 10^{13}$ cm$^{-3}$ in order to compensate the thermal double donor concentration.

To minimize parasitic substrate influences, for example, on the performance of high frequency devices, the substrate should comprise a specific resistivity ρ as high as possible. As it is shown in FIG. 2, the specific resistivity ρ is very sensitive to the generated thermal double donors. Since the generation of the thermal double donors and therewith the resistivity of the semiconductor substrate is very sensitive to the exact process parameters, for example, the temperature during the final fabrication process or the concentration of interstitial oxygen in the semiconductor substrate, the resistivity of the semiconductor substrate is difficult to manufacture reproducibly. If the generation of thermal donors cannot be prevented during processing of the semiconductor substrate, for example, by the application of silicon with a very low oxygen concentration, or by other means, then a reproducible high-ohmic semiconductor substrate is not manufacturable, because the high resistivity cannot be maintained during processing. As it is shown in FIG. 2, high-ohmic silicon (e.g., ρ>1000 Ohm cm) is in the presence of thermal donors, say thermal double donors with a concentration of $1 \times 10^{13}$ cm$^{-3}$ or higher, for example, is only achievable, in certain peak regions of the curves 25b, 25c, and 25d, for example. This however requires a very precise compensation between the p-type boron base doping and the process-generated thermal double donor doping. This is hardly achievable to reproduce, since among other reasons, the generation of the thermal double donors TDD sensitively depends on the interstitial oxygen concentration in the respective semiconductor substrate and on the cooling rate during the last high temperature steps required for the fabrication of the devices.

According to an embodiment of the invention, a semiconductor substrate comprises acceptor or donor impurity atoms, whose energy levels are located within the bandgap with at least 120 meV distance from the conduction band edge, as well as from the valence band edge of the respective semiconductor material. The concentration of the impurity atoms may be larger than $1 \times 10^{12}$ cm$^{-3}$, for example, $5 \times 10^{12}$ cm$^{-3}$, larger than $1 \times 10^{13}$ cm$^{-3}$ or in another embodiment larger than $1 \times 10^{14}$ cm$^{-3}$. The concentration of the impurity atoms may be between $1 \times 10^{13}$ cm$^{-3}$ and $1 \times 10^{14}$ cm$^{-3}$ and also up to $1 \times 10^{17}$ cm$^{-3}$. Suitable impurity atoms can, for example, be gold (Au) atoms, which comprise a very deep lying acceptor level, 540 meV below the conduction band edge of silicon. This means it is close to the Fermi level $E_i$ of an intrinsic silicon substrate. The bandgap $E_G$ of silicon is about 1.12 eV at room temperature and hence, the gap center of the silicon is about 560 meV above the valence band edge and 560 meV below the conduction band edge, very close to the intrinsic level $E_i$. It is also possible to use indium atoms as impurity atoms. However the distance of the indium impurity level from the valence band edge is significantly smaller (at about 160 meV). Those acceptor levels can be used in order to compensate, for example, a n-type base doping of a semiconductor substrate. Such an n-type base doping may be created by thermal donors, or by a base doping of the semiconductor substrate with phosphorus, arsenic, or antimony.

It is also possible to compensate a p-type doped semiconductor substrate with a dopant, which comprises deep lying donor levels in the bandgap of the semiconductor substrate. In this case, in an embodiment, the concentration of the dopants, or impurity atoms, may be lower than the base doping of the semiconductor substrate. In this embodiment, a suitable dopant can be sulfur (S) or selenium (Se).

That means, in an embodiment of the invention, a semiconductor substrate may comprise a semiconductor material with a p-type doping in a first concentration and donor impurity atoms therein with a second concentration, wherein the second concentration is smaller than the first concentration.

The respective dopant, the impurity atoms respectively with the desired impurity levels in the bandgap of the semiconductor substrate, can be added to the semiconductor material of the substrate during the fabrication, for example, during the single crystal growth with the CZ growing technique. Such dopants can also be added after the fabrication of the semiconductor substrate by conventional doping processes, such as ion-implantations or thermal diffusion. This means that doping with the impurity atoms can be performed during the crystal growth of the semiconductor substrate or, for example, by diffusion or ion implantation into the unprocessed, partly processed, or processed semiconductor substrate. A wafer made of the semiconductor material for the semiconductor substrate can be also doped with the impurity atoms during fabrication of an electronic device on the semiconductor substrate or during processing, for example, an integrated circuit on the wafer.

According to further embodiments of the invention, the semiconductor substrate comprising a high-ohmic semiconductor material can be manufactured using the CZ growing technique. In embodiments the semiconductor substrate may comprise a base doping, for example, a p-type base doping, or an n-type base doping, wherein the base doping is dimensioned so that the resistivity of the high-ohmic semiconductor material is higher than 100 Ohm cm, 500 Ohm cm, or 1000 Ohm cm, for example, 7000 Ohm cm.

Figure 3:
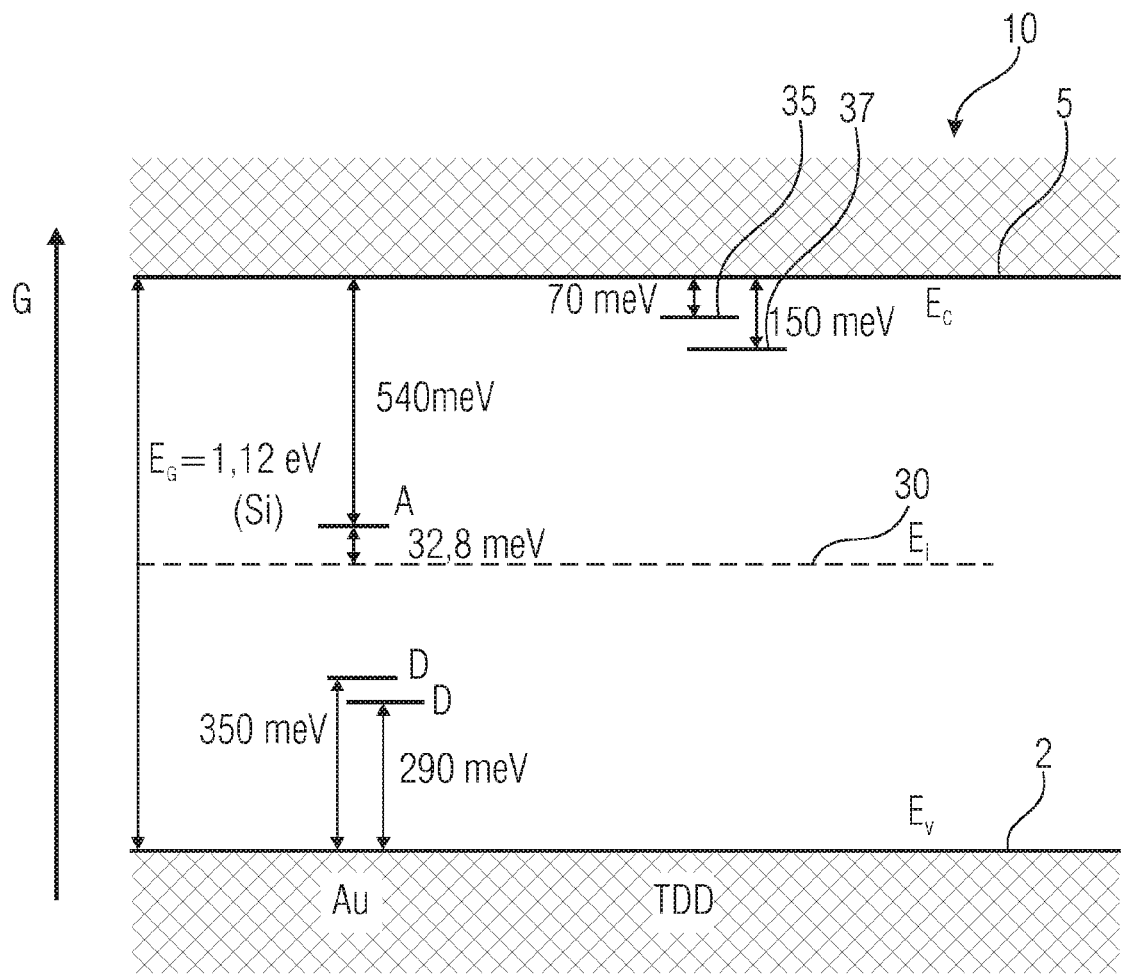
FIG. 3 shows a simplified band diagram of silicon with acceptor and donor impurity levels of e.g. gold according to an embodiment of the invention. In addition, the two donor levels of thermal double donors generated from interstitial oxygen during processing of the silicon wafer are shown.

In FIG. 3, a simplified band diagram of a silicon semiconductor substrate is depicted. The silicon (Si) semiconductor substrate 10 can comprise a conduction band edge $E_C$ 5 and a valence band edge $E_V$ 2, which are separated by a bandgap $E_G$, wherein in this example the bandgap (Si) comprises an energy interval of 1.12 eV at room temperature. The dashed line 30 in FIG. 3 depicts schematically the intrinsic energy level $E_i$ of silicon near the bandgap center. In this embodiment, the silicon semiconductor substrate 10 comprises gold as impurity atoms, wherein gold possesses acceptor levels A and donor levels D in the bandgap of the silicon substrate. The gold impurity atoms comprise two donator levels at energetic distances of 290 meV and 350 meV from the valence band edge $E_V$. Furthermore, the gold impurity atoms comprise an acceptor level A with an energetic distance of 540 meV from the conduction band edge 5. In this embodiment, the silicon substrate may be a p-type base doped CZ silicon substrate, which is used as a semiconductor substrate doped with additional gold atoms for high frequency devices. Gold comprises three energetic impurity levels in the silicon bandgap, two donor levels D at distances of 290 meV and 350 meV from the valence band edge 2, as well as an acceptor level A in a distance of 540 meV from the conduction band edge 5. The acceptor level A is very close to the intrinsic energy level 30 of the silicon semiconductor. The effect of the gold doping is two-fold since the gold atoms are amphoteric doping atoms, which comprise donor levels, as well as acceptor levels. On the one hand, the deep lying donor levels in the bandgap of the silicon semiconductor substrate result in a partial compensation of the p-type base doping, and therefore, the Fermi level will be shifted upwards in the energetic direction of the intrinsic energy level Ei (near midgap). As a consequence, the resistivity of the silicon semiconductor substrate will be significantly increased, as desired. On the other hand, the acceptor level A of the gold impurity atoms, which is 32.8 meV above the intrinsic energy level Ei of silicon at room temperature, result in an effective self-adjusting compensation of generated thermal donors. In this case, the effect results from the fact that the thermal donors shift the Fermi level in the energetic direction of the conduction band edge. Close to the gold acceptor level, some $k_B T$ (=25.9 meV) below the acceptor level A, the donors will be ionized. This ionization reduces the concentration of free electrons and counteracts thereby a further increase of the Fermi level.

The necessary concentration of the gold doping, the impurity concentration in general, depends on the maximum expected concentration of thermal donors N_TDD. As it is shown in FIG. 3, the donor levels 35, 37 of the thermal double donors are located at about 70 meV and 150 meV, below the conduction band edge 5 of the silicon semiconductor substrate 10. Because of the distance being less to the conduction band edge, the thermal donators are completely ionized under the relevant environmental conditions, as, for example, at room temperature. Each of the thermal double donors (TDD) delivers two electrons for the conductivity of the semiconductor substrate. In order to estimate the concentration of the gold doping in a first approach, the very weak p-type boron base doping can be ignored so that a gold impurity atom concentration is needed, which is at least twice the maximum thermal double donor concentration.

The doping with Au atoms is also effective in providing a high-resistivity substrate if an n-type substrate is used; this is due to the deep acceptor level.

Figure 4:
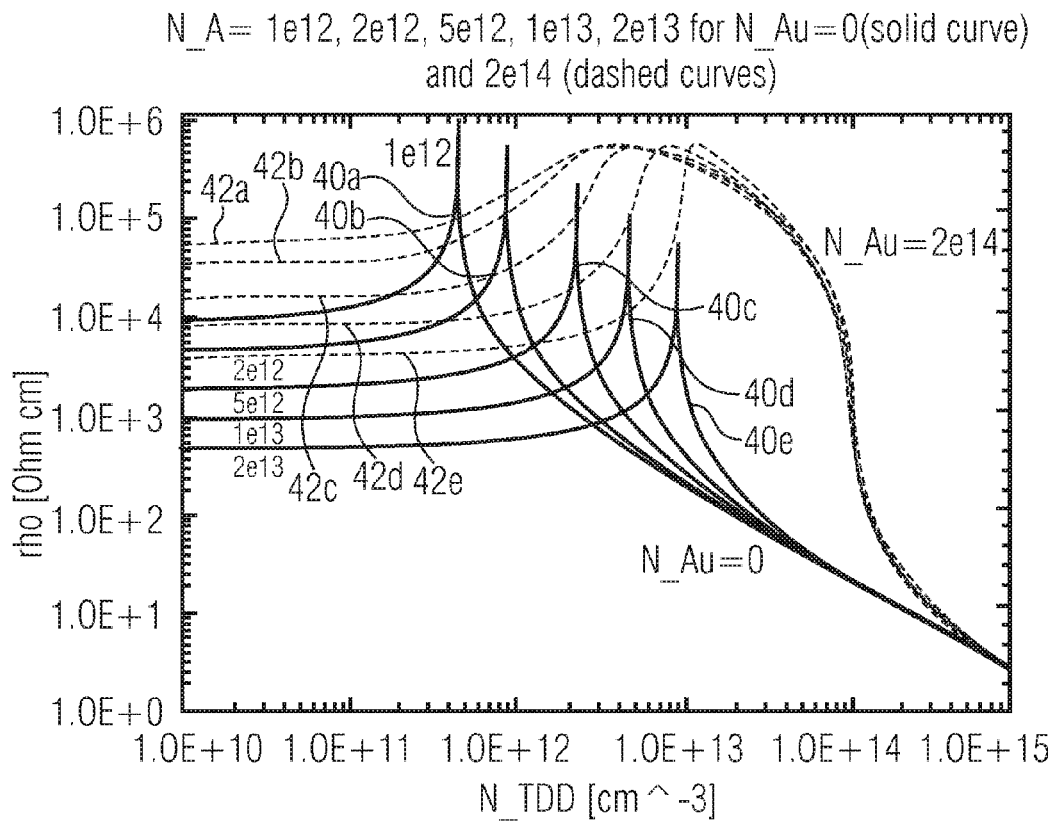
FIG. 4 shows the resistivity of silicon for different acceptor concentrations (boron doping) depending on the concentration of the thermal double donors and the influence of gold doping on the resistivity of silicon according to a further embodiment of the invention.

FIG. 4 shows the resistivity of a silicon semiconductor substrate for different p-type boron doping acceptor concentration N_A depending on the concentration of the thermal double donors TDD. On the x-axis, the concentration of the thermal double donors is depicted and on the y-axis of the diagram in FIG. 4, the specific resistance $\rho$ is shown in Ohm cm. The boron doping acceptor concentration N_A is depicted for concentration values $1\times10^{12}$ cm$^{-3}$ 40a, $2\times10^{12}$ cm$^{-3}$ 40b, $5\times10^{12}$ cm$^{-3}$ 40c, $1\times10^{13}$ cm$^{-3}$ 40d and $2\times10^{13}$ cm$^{-3}$ 40e. The respective solid curves 40a to 40e show the resistivity of the silicon semiconductor substrate depending on the thermal double donors concentration N_TDD without gold doping. The effect of a gold compensation doping as suggested in embodiments of this invention is shown for a gold doping concentration of N_Au=$2\times10^{14}$ cm$^{-3}$. The dashed curves 42a to 42e correspond to the respective acceptor concentration curves 40a to 40e. As can be seen in the diagram of FIG. 4, for a weak thermal double donor concentration, the resistivity of the semiconductor substrate can be increased by the gold doping. For higher thermal double donor concentrations N_TDD, in this example up to about $1\times10^{14}$ cm$^{-3}$, a compensation of the thermal double donors can be accomplished by the Au doping so that a high resistivity $\rho$ can be achieved almost independent of the p-type base doping N_A and the thermal double donor concentration N_TDD. In other words, the narrow peaks of the curves 40a to 40e are significantly spread (widened) by the gold impurity atoms. This means that in this embodiment, a desirable high resistivity of the silicon semiconductor substrate, can be achieved without an exact matching between the p-type base doping and the thermal double donor concentration of the semiconductor substrate. The compensation effect disappears in this example for a thermal double donor concentration N_TDD larger than 0.5×N_AU. The reason for this is mentioned above. In FIG. 4 the example of a gold doping with concentration N_AU=2×10$^{14}$ cm$^{-3}$ is sufficient for thermal double donor concentrations up to N_TDD=1×10$^{14}$ cm$^{-3}$. The thermal double donor concentration depends on the thermal budget, which the semiconductor substrate sees during processing, and also on the interstitial oxygen concentration in the semiconductor substrate. Therefore, the minimum concentration of gold impurity atoms, for example, has to be matched accordingly.

According to embodiments of the invention, the acceptor or donator impurity atoms can comprise either acceptor impurity levels or donor impurity levels, or both. Such impurity atoms, which comprise acceptor and donor levels are sometimes called amphoteric atoms. The semiconductor substrate may be silicon, but can also be any other semiconductor substrate such as gallium arsenide, gallium nitride, germanium, gallium phosphide, or silicon carbide. The impurity atoms may, for example, be gold, platinum, selenium, sulfur, chromium, tantalum, zinc, cobalt, sodium, nickel, strontium, wolfram, copper, iron, germanium, titanium, magnesium or other chemical elements and dopants not named herein, but with at least one acceptor or donor impurity level, which is located at least 120 meV from the conduction band edge as well as from the valence band edge in the bandgap of the respective semiconductor substrate.

Figure 5:
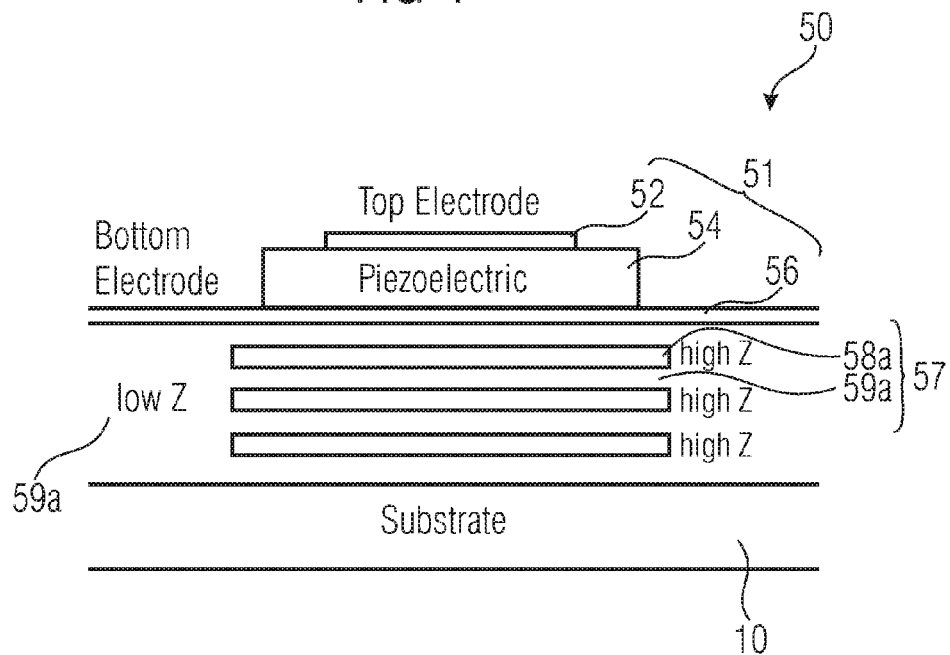
FIG. 5 shows a schematic cross-section of a bulk acoustic wave resonator on a semiconductor substrate according to another embodiment of the invention.

FIG. 5 shows a schematic cross-section of a high frequency device 50, in this case, a bulk acoustic wave resonator (BAW). The resonator 51 comprises a bottom electrode 56, a piezoelectric layer 54, and a top electrode 52. Below the resonator 51, a so-called acoustic mirror 57 is arranged, which is responsible for the acoustic decoupling of the oscillating resonator from the semiconductor substrate 10. The acoustic mirror 57 comprises an order of layers with alternating high (high-Z) and low (low-Z) acoustic impedances. Such layers may, for example, comprise wolfram and silicon oxide. The resonator 51 may be together with other resonators arranged on a common semiconductor substrate 10. As already mentioned above in order to avoid parasitic losses, the substrate 10 should be insulating, semi-insulating, or should be high-ohmic. The semiconductor substrate 10 can comprise, as it is described above, impurity atoms in order to ensure a higher resistivity as it is explained in context to FIG. 4. The silicon semiconductor substrate should comprise at least a specific resistance of 500 Ohm cm. Alternatively it may even comprise a higher specific resistance, for example, 2000 Ohm cm up to 4000 Ohm cm or even still higher, for example, up to 7000 Ohm cm.

In embodiments of the invention, an electrical or electronic device or, for example, a high frequency device may be arranged on a high-ohmic semiconductor substrate, wherein the semiconductor substrate comprises a high-ohmic semiconductor material with a conduction band edge and valence band edge separated by a bandgap, wherein the semiconductor material comprises acceptor or donor impurity atoms or irradiation-induced crystal defects, whose impurity levels within the semiconductor bandgap are located at least 120 meV from the conduction band edge, as well as from the valence band edge.

The concentration of the impurity atoms may be larger than 1×10$^{12}$ cm$^{-3}$. It may be, for example, larger than 1×10$^{13}$ cm$^{-3}$ or in another embodiment it may be between 1×10$^{13}$ cm$^{-3}$ and 1×10$^{14}$ cm$^{-3}$. The electronic device on the semiconductor substrate may comprise an electronic zone on the semiconductor substrate. In this electronic zone the actual functional electronic circuit is formed. The semiconductor substrate is high-ohmic, as abovementioned.

In an embodiment of the invention the high frequency device may be operated at frequencies higher than 500 MHz, for example, at frequencies between 1 GHz and 30 GHz. The high frequency device may be a BAW filter with a quality factor Q higher than 1000.

According to another embodiment the electronic device may be a high frequency device comprising a resonator structure, which is formed by a piezoelectric layer between a top electrode separated from a bottom electrode, and wherein between the semiconductor substrate and the bottom electrode at least one layer with a high acoustic impedance and at least one layer with a low acoustic impedance is arranged.

In an embodiment, the semiconductor substrate 10 might not comprise any regions, with a doping concentration higher than 1×10$^{16}$ cm$^{-3}$ that means, for example, the semiconductor substrate need not comprise highly doped contact zones. In another embodiment the semiconductor substrate might not comprise areas with a resistivity lower than 100 Ohm cm.

The high frequency device may comprise a resonator structure 51 formed by a piezoelectric layer 54 between a top electrode 52 and a bottom electrode 56. Between the semiconductor substrate 10 and the bottom electrode 56, at least one layer 58a with a high acoustic impedance (high-Z) and at least one layer 59a with a low acoustic impedance (low-Z) are arranged.

According to an embodiment of the invention, the high frequency device 50 may be a bulk acoustic wave resonator, but in other embodiments of the invention, the high frequency device may comprise inductor coils or capacitors. The high frequency device may be in some embodiments a passive high frequency device, in other embodiments the device may be in general an electronic device or a semiconductor device.

An electronic device may comprise a substrate, wherein at least 50% or 100% of the substrate volume comprises semiconductor material with the abovementioned impurity atoms or crystal defects and wherein the substrate forms a drift or base region of the electronic device.

Figure 6:
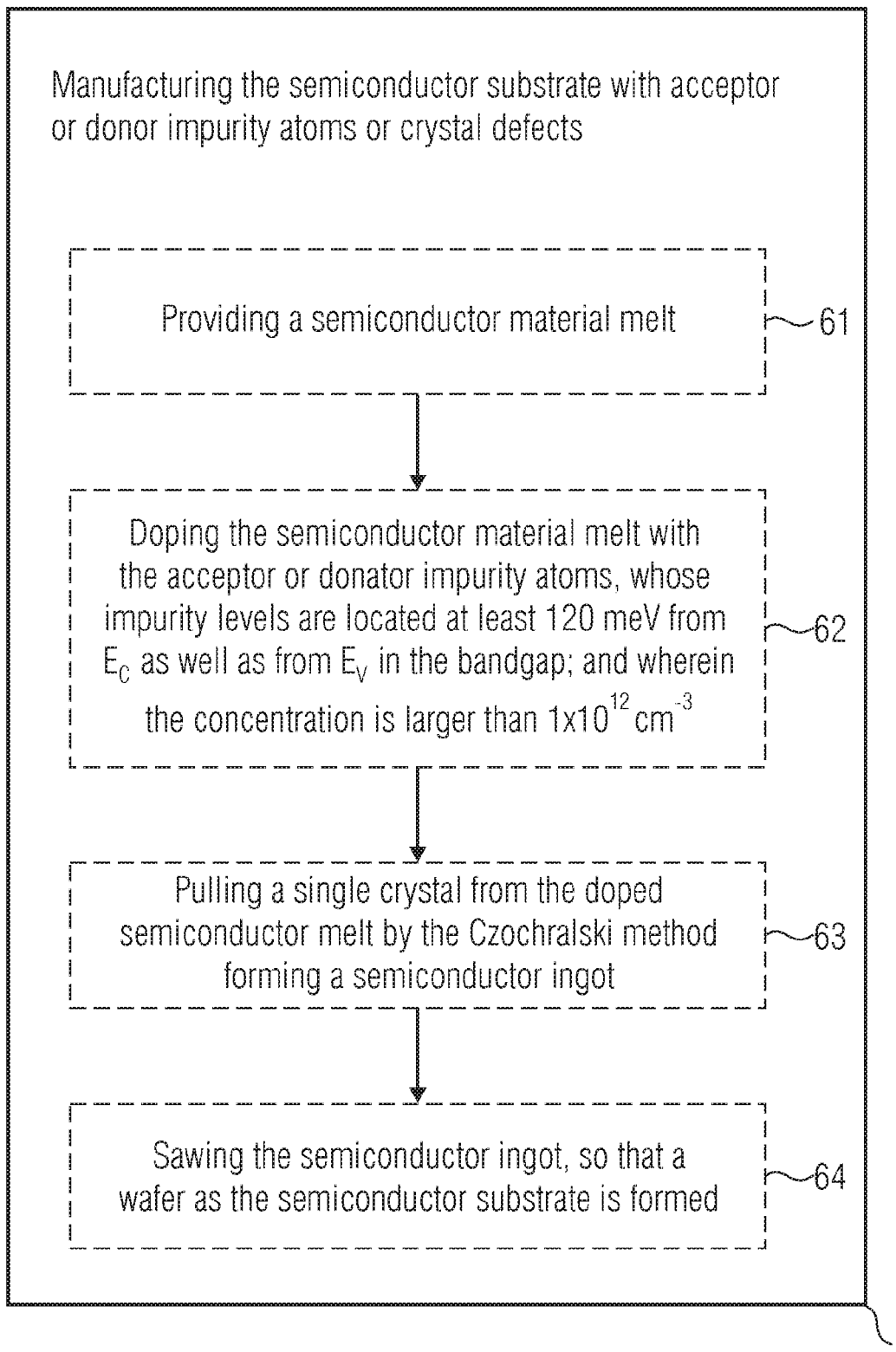
FIG. 6 shows a flow-chart of the method for manufacturing a semiconductor substrate according to an embodiment of the invention.

FIG. 6 shows, for example, a method for manufacturing a semiconductor substrate with a high-ohmic semiconductor material with a conduction band edge and a valence band edge separated by a bandgap. The method comprises in step 60, manufacturing the semiconductor substrate so that the semiconductor material comprises acceptor or donor impurity atoms or crystal defects, whose energy levels are located at least 120 meV from the conduction band edge as well as from the valence band edge in the bandgap; and wherein the concentration of the impurity atoms or crystal defects is larger than 1×10$^{12}$ cm$^{-3}$.

As it is shown in FIG. 6, in an embodiment of the method the manufacturing 60 of a semiconductor substrate may comprise in step 61, providing a semiconductor material melt and in step 62, a doping of the semiconductor material melt with acceptor or donor impurity atoms as well as in step 63, pulling of a single crystal from the doped semiconductor material melt in a crucible by the CZ method. Thereby a semiconductor ingot is formed. The method can further comprise in step 64, sawing the semiconductor ingot, so that a wafer, comprising the doped semiconductor material, is formed serving as the semiconductor substrate.

According to another embodiment of the method, the doping is performed after the sawing of the wafer. The doping may be, for example, performed by means of ion implantation and thermal diffusion. In another embodiment of the method, the doping 62 is performed so that the concentration of the impurity atoms is larger than $1 \times 10^{13}$ cm$^{-3}$ or larger than $1 \times 10^{14}$ cm$^{-3}$. As it is described above, the doping with impurity atoms may be performed so that gold, indium, sulfur, platinum, or selenium atoms are introduced into the semiconductor substrate. Diffusion temperature and diffusion time should be chosen in such a way that the penetration depth of these atoms is at least 50% of the substrate bulk volume.

The method may further comprise a base doping of the semiconductor substrate, wherein the base doping is dimensioned so that the specific resistivity of the semiconductor material is higher than $1 \times 10^2$ Ohm cm. The base doping may be a p-type base doping or it may also be a n-type base doping. For the p-type base doping, the dopant may, for example, be boron, aluminum, or indium. For the n-type base doping, the doping may be performed with phosphorus, arsenic or antimony atoms. The n-type base doping may also be based on a doping with interstitial oxygen and the resulting thermal donors. The manufacturing 60 of the semiconductor device may be performed so that the concentration of the impurity atoms is between $1 \times 10^{13}$ cm$^{-3}$ and $1 \times 10^{15}$ cm$^{-3}$, if the semiconductor substrate comprises a concentration of interstitial oxygen between $1 \times 10^{17}$ cm$^{-3}$ and $1 \times 10^{18}$ cm$^{-3}$.

In another embodiment, the method may further comprise a determination of the concentration of the interstitial oxygen in the semiconductor substrate and thereafter, based on the determined concentration of interstitial oxygen, the determination of the necessary concentration for the doping of the semiconductor material of the semiconductor substrate with acceptor or donor impurity atoms is determined. This means, for example, during the production of the semiconductor substrate, from a test wafer or test semiconductor substrate, the concentration of the interstitial oxygen may be determined, i.e., measured, detected or calculated. Based on this result, the doping of the semiconductor substrate is performed with a concentration depending on the determined interstitial oxygen concentration. As mentioned above, this concentration value may, among others, depend on the thermal budget, which the semiconductor substrate will see during the subsequent fabrication process or on the concentration of oxygen in the semiconductor substrate.

According to another embodiment of the invention the manufacturing of the crystal defects is performed by irradiating the substrate with light high-energetic particles, e.g., electrons or by irradiating the substrate with high-energetic electromagnetic radiation, e.g., gamma radiation. By irradiating the substrate, crystal defects can be generated with energy levels within the bandgap of the semiconductor material. The irradiation can be performed so that at least 50% or 100% of the substrate volume comprises semiconductor material with crystal defects, with energy levels, which are located at least 120 meV from the conduction band edge, as well as from the valence band edge in the bandgap of semiconductor material.

In embodiments of the method for manufacturing a semiconductor substrate, the manufacturing may comprise introducing impurity atoms into the semiconductor material by means of diffusion processes or ion-implantation with subsequent high-temperature diffusion steps. The impurity atoms may be introduced into the starting crystal material, i.e., the unprocessed wafer by means of diffusion processes or ion-implantation with subsequent high-temperature steps.

According to embodiments, the manufacturing of the semiconductor substrate may further comprise a p-type base doping of the semiconductor substrate, wherein the semiconductor substrate comprises a concentration of interstitial oxygen between $1 \times 10^{17}$ cm$^{-3}$ and $1 \times 10^{18}$ cm$^{-3}$, so that the semiconductor substrate comprises a semiconductor material with a specific resistivity higher than $1 \times 10^2$ Ohm cm and a doping with acceptor or donor impurity atoms.

According to embodiments, the doping with impurity atoms with deep lying impurity acceptor or donor levels can occur during the manufacturing of the semiconductor substrate or afterwards. The doping can occur during the single crystal growths, for example, according to the CZ growth technique. The doping during the single crystal growth according to the CZ growing technique may lead to a homogenous doping of the acceptor or donor impurity atoms in the resulting single crystal.

Moreover the reduction of a thermal budget during processing of electronic devices can be avoided by employing abovementioned method. This means also that process temperatures at about 450° C.±20° C. can be employed, which have been critical so far because of the creation of TDD. In embodiments of the described method the thermal budget for process steps being employed can be modified in a wider range compared to methods employed so far, since the described method establishes a fabrication process, which is less dependent on a narrow process window. Therefore it can be avoided to employ a temperature budget within a certain small limit, since the process temperatures can strongly influence any process, layer and device characteristic. The influence of the temperature on the creation of thermal donors still depends on other factors, e.g., the concentration of interstitial oxygen in the semiconductor substrate during processing.

Furthermore no additional annealing steps at higher temperatures, for example, by a rapid thermal annealing (RTA) at temperatures of about 900° C. in order to destroy at least some part of the generated thermal donors, are necessary by employing the described method of manufacturing the semiconductor substrate. Although annihilating thermal donors by some high temperature annealing is a simple approach to manufacture RF devices on (initially) high-ohmic substrates, such an approach has an important drawback. The reason is that such a high temperature annealing step can only be performed before the so-called Back-End-of-Line (BEOL) processing steps in device manufacturing, as certain metals, such as, for example, aluminum endure only moderate temperatures up to 400° C. only. A wipeout of the thermally generated donors is thus only possible before the BEOL processes, and new thermal donors will be created after the wipeout. In embodiments of the described method it is not necessary to apply a special high temperature, in order to destroy the thermal generated donors. The doping with impurity atoms as described herein may lead to a suitable compensation of those thermal donors.

The use of the abovementioned float zone (FZ) material, which comprises only a small concentration of interstitial oxygen, can be avoided as well for the fabrication of RF devices on high-ohmic semiconductor substrates. So far the float zone material is hardly available for 200 mm wafer and in addition quite expensive. Employing the abovementioned method for manufacturing the semiconductor substrate, the CZ method can be employed, which is less expensive and 200 mm wafers are easier to fabricate.

High fluctuations of the resistivity of the semiconductor substrate as well as of the concentration of the generated thermal donors can be compensated by employing the method of manufacturing a semiconductor substrate as described in embodiments herein. Particularly, the generation rate of the thermal donors is very sensitive to different factors, as the concentration of interstitial oxygen or other contaminants like hydrogen or carbon, for example.

In a conventional approach to fabricate a stable high-ohmic semiconductor substrate or to fabricate RF devices on such high-ohmic semiconductor substrates, there is a certain risk for an insufficient or overdosed compensation of an initial substrate base doping, for example, for a p-type boron base doping. In both case, there would be an undesirable low-ohmic substrate generated. As it is shown by the narrow peaks in the curves in FIGS. 2 and 4, the resistivity depends very sensitively on the exact fabrication and doping conditions and may vary easily by several orders of magnitude. In a conventional approach to fabricate a high-ohmic substrate, the process window for a correct compensation of the substrate is therefore very narrow and may not be available at all, if a high amount of thermal donors is created. By fabricating a high-ohmic semiconductor substrate with the herein described method, by means of impurity atoms with a deep acceptor level, the process window for a correct compensation can be enlarged and hence the fabrication of a reproducible high-ohmic semiconductor substrate or RF devices on such a substrate is easier to achieve compared to a conventional approach.

According to another embodiment the semiconductor substrate may comprise a contamination with other different impurity atoms, which may have a concentration lower than $1 \times 10^9$ cm$^{-3}$ or lower than $1 \times 10^{10}$ cm$^{-3}$. The contamination impurity atom concentration may be below or close to the detection limit of suitable measurement apparatus. This means that an intrinsic contamination concentration of the semiconductor substrate may be below the detection limit of $10^9$ cm$^{-3}$. The type of contamination impurity atoms in the semiconductor substrate may depend on the manufacturing process of the semiconductor substrate and may be different to those impurity atoms added on purpose to compensate for a doping of the semiconductor material.

In embodiments, in an ideal case the semiconductor substrate comprises no doping atoms, electronic devices, for example, the high frequency devices, can then be mounted on such high-ohmic substrates. Such high-ohmic substrates may have a resistivity up to 8000 Ohm cm. According to embodiments, the semiconductor substrate comprising the high-ohmic semiconductor material may act as a carrier substrate material for an electronic device, for example, a high frequency device. Oxygen in a silicon semiconductor substrate increases the mechanical stability of the semiconductor substrate and enables gettering processes at temperatures of about 450° C., for example, in the first 30 minutes, which may lead to the forming of oxygen complexes known as thermal (double) donors.

In embodiments of the invention, a high-ohmic semiconductor substrate comprises impurity atoms, these impurity atoms may comprise either acceptor impurity levels or donor impurity levels, or both. That is, the impurity atoms may be amphoteric and may comprise at least one deep energy impurity level within the bandgap of the corresponding semiconductor substrate. The distance of the conduction band edge may be at least 120 meV, 150 meV, or at least 200 meV. The same may be valid for the valence band edge, so that the distance between the impurity levels and the valance band edge may be at least 120 meV, 150 meV, or at least 200 meV. In other words, the energetic distance between the impurity levels introduced by the impurity atoms may be at least 120 meV, 150 meV, or 200 meV to the conduction band edge and the valence band edge.

It should be noted that in embodiments of the invention frequently a silicon semiconductor substrate is depicted. These embodiments are given by way of illustration only and not by way of limitation. Therefore the semiconductor substrate may be in other embodiments different to silicon, for example, germanium with a bandgap of about 0.6 eV or gallium arsenide with a bandgap of 1.42 eV, or any other suitable semiconductor substrate. The impurity atoms with the respective acceptor or donor impurity level described above may, of course, be different to gold.

While the foregoing has been particularly shown and described with reference to particular embodiments thereof, it will be understood by those skilled in the art that various other changes in the form and the details may be made without departing from the spirit and the scope thereof. It is to be understood that various changes may be made in adapting to different embodiments without departing from the broader concepts disclosed herein and comprehend by the claims follow.

What is claimed is:

1. A semiconductor substrate comprising a high-ohmic semiconductor material with a conduction band edge and a valence band edge, separated by a bandgap,
    wherein the semiconductor material comprises a base doping and donor impurity atoms different from the base doping or a base doping and crystal defects,
    wherein energy levels of the donor impurity atoms or crystal defects are located at least 120 meV from the conduction band edge, as well as from the valence band edge in the bandgap,
    wherein the donor impurity atoms comprise selenium (Se), wherein a concentration of the selenium is larger than $1 \times 10^{12}$ cm$^{-3}$ and lower than $1 \times 10^{17}$ cm$^{-3}$,
    wherein the semiconductor substrate is a silicon substrate, wherein the base doping is a p-type base doping,
    wherein the semiconductor substrate includes an electronic device zone comprising the selenium (Se) atoms, wherein at least 50% of the volume of the semiconductor substrate comprises the semiconductor material with said donor impurity atoms or crystal defects, and wherein a region of the semiconductor substrate comprising the selenium atoms forms at least a portion of a drift or base region of the electronic device.

2. The semiconductor substrate according to claim 1, wherein the semiconductor material is manufactured using a Czochralski or Magnetic Czochralski growing technique.

3. The semiconductor substrate according to claim 1, wherein a concentration of interstitial oxygen in the semiconductor substrate is between $1 \times 10^{17}$ cm$^{-3}$ and $1 \times 10^{18}$ cm$^{-3}$; and
    wherein concentration of impurity atoms is between $1 \times 10^{13}$ cm$^{-3}$ and $1 \times 10^{15}$ cm$^{-3}$.

4. The semiconductor substrate according to claim 1, comprising a base doping, wherein the base doping is dimensioned so that specific resistivity of the semiconductor material is higher than $1 \times 10^2$ Ohm cm.

5. The semiconductor substrate according to claim 1, wherein the semiconductor material has a concentration of interstitial oxygen between $1 \times 10^{17}$ cm$^{-3}$ and $1 \times 10^{18}$ cm$^{-3}$, and a doping with impurity atoms comprising donor impurity levels.

6. The semiconductor substrate according to claim 1, wherein the semiconductor substrate comprises a semiconductor material with the p-type doping in a first concentration and the donor impurity atoms with a second concentration smaller than the first concentration.

7. An electronic device on the semiconductor substrate according to claim 1, wherein the electronic device comprises a high frequency device.

8. The high frequency device according to claim 7, wherein the high frequency device comprises a bulk acoustic wave resonator.

9. A method for manufacturing a semiconductor substrate comprising a high-ohmic semiconductor material with a conduction band edge and a valence band edge, separated by a bandgap, the method comprising:

manufacturing the semiconductor substrate so that the semiconductor material comprises a base doping and donor impurity atoms different from the base doping or a base doping and crystal defects, wherein energy levels of the donor impurity atoms or crystal defects are located at least 120 meV from the conduction band edge as well as from the valence band edge in the bandgap;

wherein the donor impurity atoms comprise selenium (Se), wherein a concentration of the selenium is greater than $1\times10^{12}$ cm$^{-3}$ and lower than $1\times10^{17}$ cm$^{-3}$, wherein the semiconductor substrate is a silicon substrate, wherein the base doping is a p-type base doping, wherein the semiconductor substrate includes an electronic device zone comprising the selenium (Se) atoms, wherein at least 50% of the volume of the semiconductor substrate comprises the semiconductor material with said donor impurity atoms or crystal defects, and wherein a region of the semiconductor substrate comprising the selenium atoms forms at least a portion of a drift or base region of the electronic device.

10. The method according to claim 9, wherein the manufacturing comprises introducing impurity atoms into the semiconductor material using diffusion processes or ion-implantation with subsequent high-temperature diffusion steps.

11. The method according to claim 9, further comprising base doping the semiconductor material, wherein the base doping is dimensioned so that a specific resistivity of the semiconductor material is greater than $1\times10^{2}$ Ohm cm.

12. The method according to claim 9, wherein the manufacturing is performed so that the concentration of the impurity atoms or crystal defects is between $1\times10^{13}$ cm$^{-3}$ and $1\times10^{15}$ cm$^{-3}$, if the semiconductor substrate comprises a concentration of interstitial oxygen between $1\times10^{17}$ cm$^{-3}$ to $1\times10^{18}$ cm$^{-3}$.

13. The method according to claim 9, further comprising determining a concentration of interstitial oxygen in the semiconductor substrate; and determining a concentration for doping of the semiconductor substrate with donor impurity atoms based on the determined concentration of interstitial oxygen.

14. The method according to claim 9, further comprising determining a concentration of interstitial oxygen in a test semiconductor substrate; and wherein the manufacturing of the semiconductor substrate is performed with a concentration of the impurity atoms or crystal defects depending on the determined interstitial oxygen concentration in the test semiconductor substrate wherein the concentration of the impurity atoms or crystal defects is at least twice a maximum thermal double donor concentration of thermal double donors generated from interstitial oxygen during processing of the semiconductor material.

15. The method according to claim 9, wherein manufacturing the semiconductor substrate further comprises the p-type base doping of the semiconductor substrate, which comprises a concentration of interstitial oxygen between $1\times10^{17}$ cm$^{-3}$ and $1\times10^{18}$ cm$^{-3}$ so that the semiconductor substrate comprises a specific resistance of the semiconductor material higher than $1\times10^{2}$ Ohm cm and a doping with impurity atoms comprising donor impurity levels within the bandgap of the semiconductor material.

16. The method according to claim 9, wherein the semiconductor substrate has crystal defects manufactured by irradiating the semiconductor substrate with light high-energetic particles or gamma radiation.

17. A semiconductor substrate comprising a high-ohmic semiconductor material with a conduction band edge and a valence band edge, separated by a bandgap, wherein the semiconductor material is manufactured using a Czochralski or Magnetic Czochralski growing technique, wherein the semiconductor material comprises a base doping and donor impurity atoms different from the base doping or a base doping and crystal defects, wherein energy levels of the donor impurity atoms or crystal defects are located at least 120 meV from the conduction band edge, as well as from the valence band edge in the bandgap;

wherein the donor impurity atoms comprise selenium (Se), wherein concentration of the selenium is larger than $1\times10^{13}$ cm$^{-3}$ and lower than $1\times10^{17}$ cm$^{-3}$, wherein the semiconductor substrate is a silicon substrate, wherein the base doping is a p-type base doping, and wherein the semiconductor substrate includes an electronic device zone comprising the selenium (Se) atoms, wherein at least 50% of the volume of the semiconductor substrate comprises the semiconductor material with said donor impurity atoms or crystal defects, and wherein a region of the semiconductor substrate comprising the selenium atoms forms at least a portion of a drift or base region of the electronic device.

18. A semiconductor substrate comprising a high-ohmic semiconductor material with a conduction band edge and a valence band edge, separated by a bandgap, wherein the semiconductor material comprises a base doping and donor impurity atoms different from the base doping or a base doping and crystal defects, wherein energy levels of the donor impurity atoms or crystal defects are located at least 120 meV from the conduction band edge, as well as from the valence band edge in the bandgap, wherein the donor impurity atoms comprise selenium (Se), wherein concentration of the selenium is larger than $1\times10^{13}$ cm$^{-3}$;

wherein the semiconductor material has a concentration of interstitial oxygen between $1\times10^{17}$ cm$^{-3}$ and $1\times10^{18}$ cm$^{-3}$, wherein the semiconductor substrate is a silicon substrate, wherein the base doping is a p-type base doping, and wherein the semiconductor substrate includes an electronic device zone comprising the selenium (Se) atoms, wherein at least 50% of the volume of the semiconductor substrate comprises the semiconductor material with said donor impurity atoms or crystal defects, and wherein a region of the semiconductor substrate comprising the selenium atoms forms at least a portion of a drift or base region of the electronic device.

19. A semiconductor substrate comprising a high-ohmic semiconductor material with a conduction band edge and a valence band edge, separated by a bandgap, wherein the semiconductor material comprises a p-type doping of a first concentration and donor impurity atoms whose energy levels are located at least 120 meV from the conduction band edge, as well as, from the valence band edge in the bandgap, wherein the donor impurity atoms comprise selenium (Se), wherein the selenium has a second concentration smaller than the first concentration, wherein the second concentration is larger than $1\times10^{12}$ cm$^{-3}$ and lower than $1\times10^{17}$ cm$^{-3}$, wherein the semiconductor substrate is a silicon substrate, wherein the semiconductor substrate includes an electronic device zone comprising the selenium (Se) atoms, wherein at least 50% of the volume of the semiconductor substrate comprises the semiconductor material with said donor impurity atoms or crystal defects, and wherein a region of the semiconductor substrate comprising the selenium atoms forms at least a portion of a drift or base region of the electronic device.

20. The semiconductor substrate according to claim 1, wherein a whole wafer bulk volume comprises semiconductor material with the impurity atoms or crystal defects.

21. The semiconductor substrate according to claim 1, wherein the semiconductor material comprises the base doping and the donor impurity atoms different from the base doping.

22. The semiconductor substrate according to claim 1, wherein the semiconductor material comprises the base doping and the crystal defects.

23. The semiconductor substrate according to claim 1, wherein a resistivity of the high-ohmic semiconductor material is higher than 1000 Ohm cm.

24. The semiconductor substrate according to claim 17, wherein a resistivity of the high-ohmic semiconductor material is higher than 500 Ohm cm.

25. The semiconductor substrate according to claim 17, wherein the semiconductor material comprises the base doping and the donor impurity atoms different form the base doping.

26. The semiconductor substrate according to claim 17, wherein the semiconductor material comprises the base doping and the crystal defects.

27. The semiconductor substrate according to claim 17, wherein the impurity atoms comprise the sulfur atoms.

28. The semiconductor substrate according to claim 17, wherein the semiconductor substrate comprises a semiconductor material with the p-type doping in a first concentration and the donor impurity atoms with a second concentration smaller than the first concentration.

29. The semiconductor substrate according to claim 19, wherein the electronic device zone comprises the sulfur atoms.

30. The semiconductor substrate according to claim 19, wherein a specific resistivity of the high-ohmic semiconductor material is higher than 1000 Ohm cm.

31. The semiconductor substrate according to claim 19, wherein the electronic device comprises a high frequency device with a resonator structure.

32. The semiconductor substrate according to claim 31, wherein the high frequency device comprises:
 a piezoelectric layer arranged between a top electrode and a bottom electrode;
 a layer with a high acoustic impedance arranged between the semiconductor substrate and the bottom electrode; and
 a layer with a low acoustic impedance arranged between the semiconductor substrate and the bottom electrode.

* * * * *